(12) United States Patent
Pelletier

(10) Patent No.: US 10,847,461 B2
(45) Date of Patent: Nov. 24, 2020

(54) SYSTEMS AND METHODS FOR POWER MANAGEMENT

(71) Applicant: Kinetic Technologies, San Jose, CA (US)

(72) Inventor: William Robert Pelletier, Campbell, CA (US)

(73) Assignee: Kinetic Technologies, San Jose, CA (US)

( * ) Notice: Subject to any disclaimer, the term of this patent is extended or adjusted under 35 U.S.C. 154(b) by 301 days.

(21) Appl. No.: 16/044,791

(22) Filed: Jul. 25, 2018

(65) Prior Publication Data

US 2019/0035732 A1    Jan. 31, 2019

Related U.S. Application Data

(60) Provisional application No. 62/536,601, filed on Jul. 25, 2017.

(51) Int. Cl.
| | | |
|---|---|---|
| *H01L 23/528* | (2006.01) | |
| *G06F 1/3234* | (2019.01) | |
| *G06F 1/26* | (2006.01) | |
| *H01J 1/02* | (2006.01) | |
| *H02J 1/00* | (2006.01) | |

(52) U.S. Cl.
CPC .......... *H01L 23/5286* (2013.01); *G06F 1/263* (2013.01); *G06F 1/3243* (2013.01); *H01J 1/02* (2013.01); *H02J 1/00* (2013.01)

(58) Field of Classification Search
CPC .... H02J 1/00; H02J 1/02; G01R 31/40; G01R 31/52; G01R 31/54; G01R 31/64; G06F 1/263; G06F 1/3243; H01L 23/5286; H02M 3/00
USPC .......................................................... 361/17
See application file for complete search history.

(56) References Cited

U.S. PATENT DOCUMENTS

| | | | | |
|---|---|---|---|---|
| 8,619,445 B1 * | 12/2013 | Low | .................. | H02M 1/32 363/59 |
| 8,972,209 B2 * | 3/2015 | Gajic | .................. | H02H 7/16 702/58 |
| 2018/0348285 A1 * | 12/2018 | Drofenik | .................. | H01L 28/40 |

\* cited by examiner

*Primary Examiner* — Kevin J Comber
(74) *Attorney, Agent, or Firm* — Sheppard Mullin Richter & Hampton LLP

(57) ABSTRACT

A power switch may be coupled to a power input, a first capacitor, a second capacitor, and a power output. A first switch may be coupled to the first capacitor. A second switch may be coupled to the second capacitor. A current sensor may be configured to measure a first current of the first capacitor and a second current of the second capacitor. A controller may be configured to determine whether the first capacitor and the second capacitor shorts or opens based on the first current and the second current, respectively. The controller may generate one or more alerts based on opening/shorting of a capacitor, and may open a switch based on shorting of a capacitor.

22 Claims, 6 Drawing Sheets

SYSTEMS AND METHODS FOR POWER MANAGEMENT

CROSS-REFERENCE TO RELATED APPLICATIONS

This application claims the benefit of U.S. Provisional Application Ser. No. 62/536,601, filed Jul. 25, 2017, and entitled "SYSTEMS AND METHODS FOR POWER MANAGEMENT." The entirety of the aforementioned application is incorporated herein by reference.

TECHNICAL FIELD

This disclosure relates to generally to power management, and more specifically to providing intelligent input capacitor redundancy.

BACKGROUND

Input capacitors may provide reservoirs of energy and increase stability in power delivery. Failures of input capacitors (e.g., shorting, opening) may lead to inefficient/insufficient power delivery.

SUMMARY

This disclosure relates to providing power management through input capacitor redundancy. One aspect of the present disclosure is directed to a system that provides power management. The system may include a power switch, a first switch, a second switch, a current sensor, and a controller. The power switch may be coupled to a power input, a first capacitor, a second capacitor, and a power output. The first switch may be coupled to the first capacitor. The second switch may be coupled to the second capacitor. The current sensor may be coupled to the first capacitor and the second capacitor. The current sensor may be configured to measure a first current of the first capacitor and a second current of the second capacitor. The controller may be coupled to the current sensor, the first switch, and the second switch. The controller may be configured to determine whether the first capacitor and the second capacitor shorts or opens based on the first current and the second current, respectively. Responsive to the first capacitor and/or the second capacitor opening or shorting, the controller may generate one or more alerts. Responsive to the first capacitor shorting, the controller may open the first switch. Responsive to the second capacitor shorting, the controller may open the second switch.

Another aspect of the present disclosure is directed to a method for providing power management. The method may comprise: (1) measuring a first current of a first capacitor, the first capacitor coupled to a first switch and a power input; (2) measuring a second current of a second capacitor, the second capacitor coupled to a second switch and the power input; (3) determining whether the first capacitor shorts or opens based on the first current; and (4) determining whether the second capacitor shorts or opens based on the second current. Responsive to the first capacitor shorting, the first switch may be opened and a first alert that the first capacitor has shorted may be generated. Responsive to the first capacitor opening, a second alert that the first capacitor has opened may be generated. Responsive to the second capacitor shorting, the second switch may be opened and a third alert that the second capacitor has shorted may be generated. Responsive to the second capacitor opening, a fourth alert that the second capacitor has opened may be generated.

Another aspect of the present disclosure is directed a chip that provides power management. The chip may comprise a housing. The housing may include a first capacitor connector, a second capacitor connector, an input power connector, an output power connector, a current sensor, and a controller. The first capacitor connector may be configured to couple a first capacitor to a first switch. The second capacitor connector may be configured to couple a second capacitor to a second switch. The input power connector may be configured to couple to a power input. The output power connector may be configured to couple to a power output. The ground connector may be configured to couple to a ground. The current sensor may be configured to measure a first current of the first capacitor and a second current of the second capacitor. The controller may be configured to determine whether the first capacitor and the second capacitor shorts or opens based on the first current and the second current, respectively. Responsive to the first capacitor and/or the second capacitor opening or shorting, the controller may generate one or more alerts. Responsive to the first capacitor shorting, the controller may open the first switch. Responsive to the second capacitor shorting, the controller may open the second switch.

In some implementations, the power output may include a load. In some implementations, the power output may include a voltage bus. In some implementations, the controller may be coupled to the power switch, and may be configured to open the power switch based on (1) the first capacitor shorting or opening, and (2) the second capacitor shorting or opening. In some implementations, one or more of the power switch, the first switch, the second switch, the current sensor, and/or the controller may be embedded in a chip.

In some implementations, the controller may be configured to communicate one or more alerts to a computing device. The controller may communicate one or more alerts to a computing device via an inter-integrated circuit protocol, a serial communication protocol, a wireless communication protocol, and/or other communication protocols.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1A:
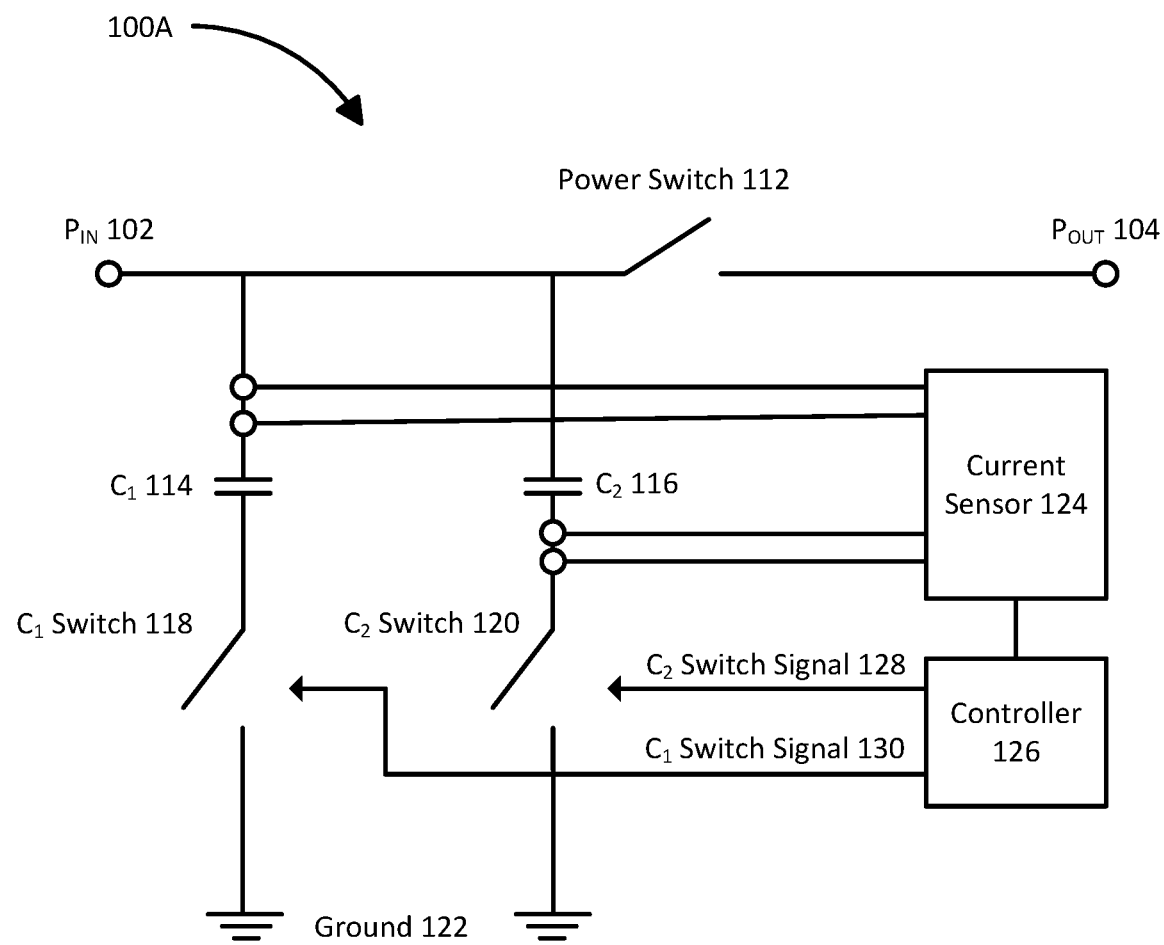
FIGS. 1A-1C illustrate example systems for power management in accordance with some implementations of the disclosure.

FIG. 1A illustrates an example system 100A that provides power management. The system 100A may include a power switch 112, a first switch 118, a second switch 120, a current sensor 124, a controller 126, and/or other components. The power switch 112, the first switch 118, and/or the second switch 120 may include one or more transistors that operate as a switch. The power switch 112 may be directly or indirectly coupled to a power input 102, a first capacitor 114, a second capacitor 116, and a power output 104. The power input 102 may receive power for the system 100A (e.g., power to be delivered to the power output 104). The power input 102 may be directly or indirectly coupled to a voltage source, a current source, and/or other power sources. In some implementations, the power output 104 may include a voltage bus. In some implementations, the power output 104 may include one or more loads (e.g., one or more devices receiving power).

The first switch 118 may be directly or indirectly coupled to the first capacitor 114 and a ground 122. The second switch 120 may be directly or indirectly coupled to the second capacitor 116 and the ground 122. The first capacitor 114 and/or the second capacitor 116 may include a fix capacitor and/or a variable capacitor.

The current sensor 124 may be directly or indirectly coupled to the first capacitor 114 and the second capacitor 116. The current sensor 124 may be configured to measure a current of the first capacitor 114 and a current of the second capacitor 116. For example, as shown in FIG. 1A, the current sensor 124 may be coupled to the positive terminal of the first capacitor 114, and may be coupled to the negative terminal of the second capacitor 116. Other coupling of the current sensor 124 to the first capacitor 114 and the second capacitor 116 to measure their currents are contemplated. While the current sensor 124 is shown in FIG. 1A as a single entity, this is merely for ease of reference and is not limiting. The current sensor 124 may include one or more current sensors and/or other sensors located in the same location or different locations.

The controller 126 may be directly or indirectly coupled to the current sensor 124, the first switch 118, and the second switch 120. The controller 126 may be configured to determine whether the first capacitor 114 shorts or opens based on the current of the first capacitor 114. The controller 126 may be configured to determine whether the second capacitor 116 shorts or opens based on the current of the second capacitor 116. For example, the controller 126 may determine that the first capacitor 114 and/or the second capacitor 116 has shorted based on the current in the respective capacitor increasing rapidly/faster than a certain rate and/or increasing beyond/to a certain level. The controller 126 may determine that the first capacitor 114 and/or the second capacitor 116 has opened based on the current in the respective capacitor decreasing rapidly/faster than a certain rate and/or dropping below/to a certain level. Other methods to determine status (shorted, opened) of the capacitors 114, 116 are contemplated. While the controller 126 is shown in FIG. 1A as a single entity, this is merely for ease of reference and is not limiting. The controller 126 may include one or more controllers/processing units located in the same location or different locations.

Responsive to the first capacitor 114 and/or the second capacitor 116 opening or shorting, the controller 126 may generate one or more alerts. For example, responsive to the first capacitor 114 opening, the controller 126 may generate an alert that the first capacitor 114 has opened. Responsive to the first capacitor 114 shorting, the controller 126 may generate an alert that the first capacitor 114 has shorted. Responsive to the second capacitor 116 opening, the controller 126 may generate an alert that the second capacitor 116 has opened. Responsive to the second capacitor 116 shorting, the controller 126 may generate an alert that the second capacitor 116 has shorted.

The alerts may be stored in one or more locations and/or communicated to one or more locations. For example, the alerts may be stored as flags (e.g., set, cleared) in the controller 126 and/or other locations. The controller 126 may be directly or indirectly coupled to a communications interface (e.g., wired and/or wireless) and may communicate the alerts to a computing device for storage/display. For example, the controller 126 may communicate one or more alerts to a computing device via an inter-integrated circuit protocol, a serial communication protocol, a wireless communication protocol, and/or other communication protocols. Storage/communication of the alerts regarding opening/shorting of the capacitors 114, 116 may enable a user to find out whether one or more of the capacitors 114, 116 are malfunctioning and require maintenance (e.g., repair, replacement).

The controller 126 may be configured to change the operating status of the first switch 118 and/or the second switch 120. The controller 126 may use control signals (e.g., switch signals 128, switch signal 130) to open or close one or more switches 118, 120. For example, responsive to the first capacitor 114 shorting, the controller 126 may open the first switch 118. Responsive to the second capacitor 116 shorting, the controller 126 may open the second switch 120. Opening the switches 118, 120 responsive to the capacitors 114, 116 shorting may enable the controller 126 to prevent the power input 102 from being grounded (e.g., to ground 122) based on failure of the capacitors 114, 116. In some implementations, the controller 126 may open the first switch 118 and/or the second switch 120 based on the first capacitor 114 and/or the second capacitor 116 opening.

Figure 1B:
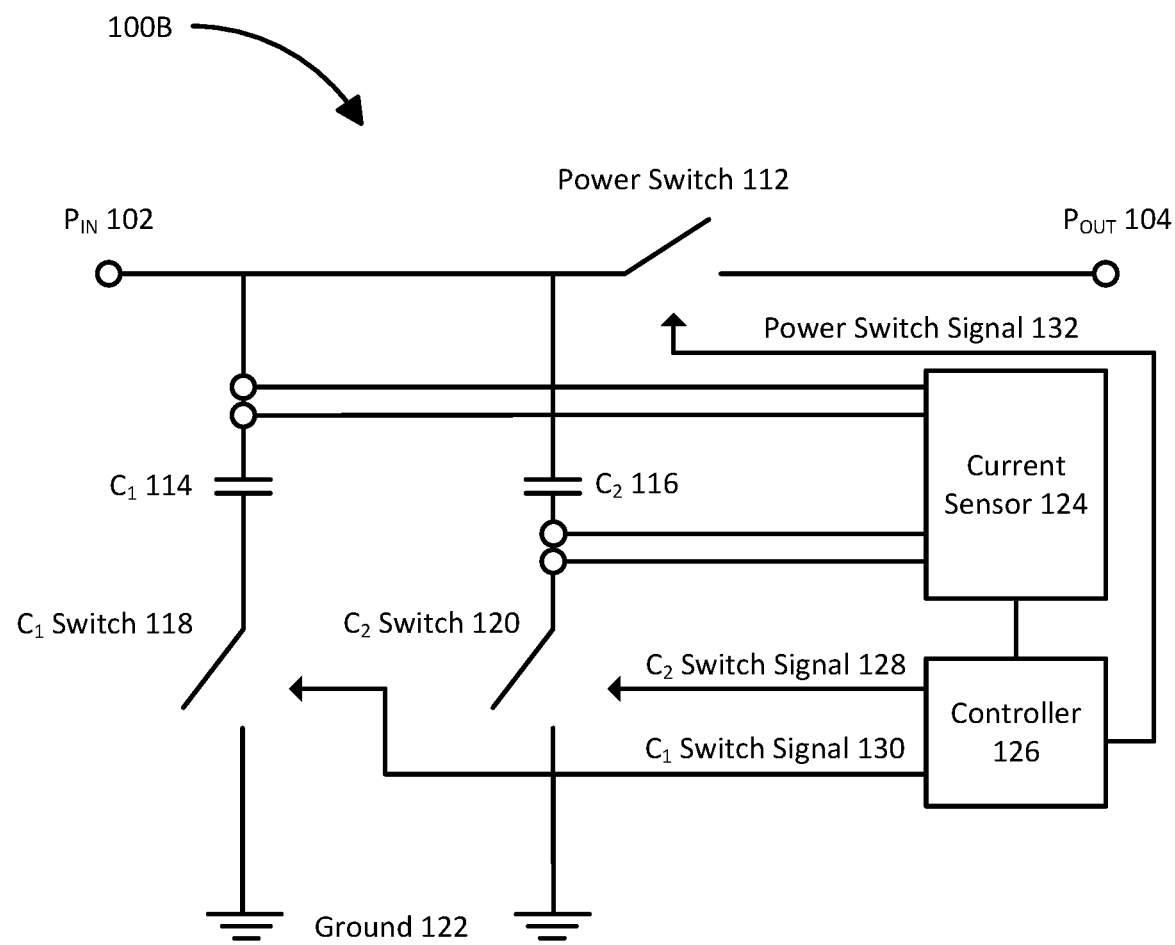

In some implementations, the controller 126 may be coupled to the power switch 112 and may be configured to change the operating status of the power switch 112. For example, FIG. 1B. shows an example system 100B that provides power management. The system 100B may include components described above with respect to the system 100A (FIG. 1A) and/or other components. Referring to FIG. 1B, the controller 126 may use control signals (e.g., power switch signal 132) to open or close the power switch 112. In some implementations, the controller 126 may be configured to open the power switch 112 based on (1) the first capacitor 114 shorting or opening, and (2) the second capacitor 116 shorting or opening. Opening the power switch 112 responsive to failures of the capacitors 114, 116 may enable the controller 126 to stop delivery of power to the power output 104 for component failure.

In some implementations, the controller 126 may be configured to open the power switch 112 based on a particular operating status of the capacitors 114, 116. For example, the controller 126 may keep the power switch 112 closed based on one of the capacitors 114, 116 opening and the other capacitor shorting. The controller 126 may keep the power switch 112 closed based on both capacitors 114, 116 opening. The controller 126 may open the power switch 112 based on both capacitors 114, 116 shorting.

Figure 1C:
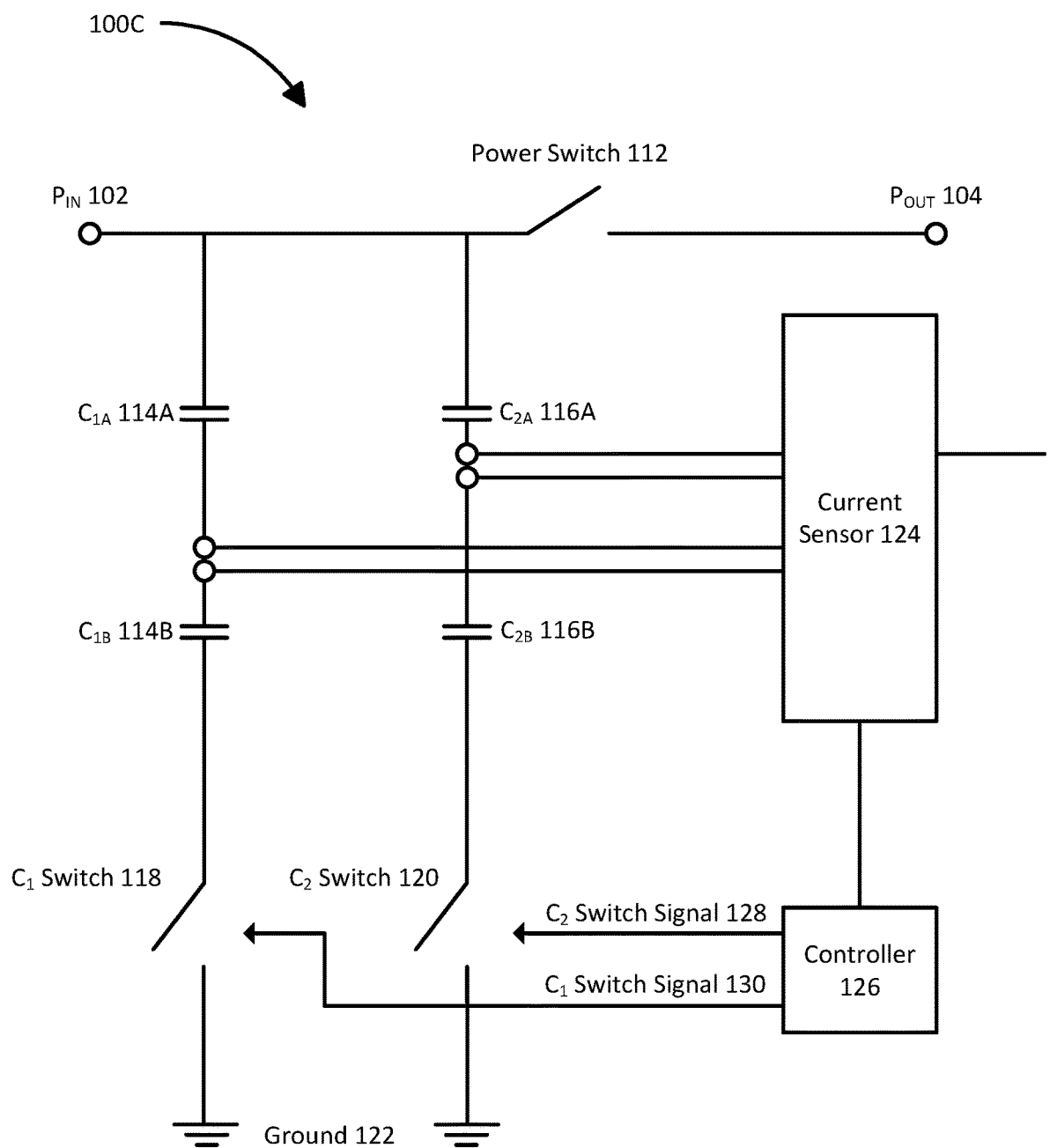

In some implementations, additional capacitors may be added to provide more redundancy. For example, FIG. 1C shows an example system 100C that provides power management. The system 100C may include components described above with respect to the system 100A (FIG. 1A) and/or the system 100B (FIG. 1B), and/or other components. As shown in FIG. 1C, the first capacitor 114 may be replaced with two capacitors 114A, 114B in series. The second capacitor 116 may be replaced with two capacitors 116A, 116B in series.

The current sensors 124 may be configured to measure the currents of the capacitors 114A, 114B, 116A, 116B. Based on these currents, the controller 126 may be configured to determine whether the capacitors 114A, 114B, 116A, 116B shorts or opens. The controller 126 may use additional information to determine whether the capacitors 114A, 114B, 116A, 116B shorts or opens. For example, the system 100C may include one or more voltage sensors (not shown) that measure the voltage across the capacitors 114A, 114B, 116A, 116B. Based on the measured currents and measured voltages, the controller 126 may determine whether the capacitors 114A, 114B, 116A, 116B shorts or opens. Other methods to determine status (shorted, opened) of the capacitors 114A, 114B, 116A, 116B are contemplated.

The controller 126 may use control signals 128, 130 to change the operating status of the switches 118, 120 based on the status of the capacitors 114A, 114B, 116A, 116B. For example, the controller 126 may open the first switch 118 based on the capacitors 114A, 114B shorting. The controller 126 may open the second switch 120 based on the capacitors 116A, 116B shorting.

Including additional capacitors in a single line may provide for additional input capacitor redundancy. For example, in FIG. 1C, one of the capacitors 114A, 114B may continue to operate as an input capacitor despite the other capacitor shorting (e.g., the first switch 118 remains closed). One of the capacitors 116A, 116B may continue to operate as an input capacitor despite the other capacitor shorting (e.g., the second switch 120 remains closed). Other numbers of capacitors are contemplated.

Figure 2:
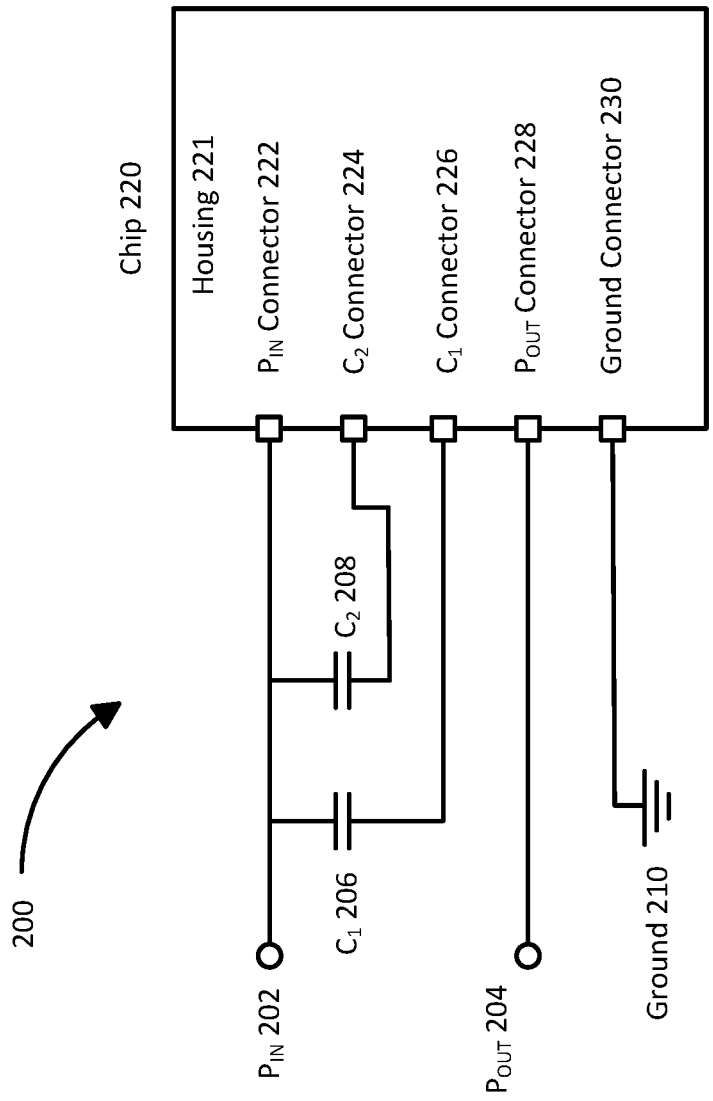
FIGS. 2-3 illustrate example chips for power management in accordance with some implementations of the disclosure.

In some implementations, one or more of the power switch 112, the first switch 118, the second switch 120, the current sensor 124, the controller 126, and/or other component may be embedded in one or more chips. FIG. 2 shows an example system 200 that provides power management. In the system 200, a chip 220 may implement the power switch 112, the first switch 118, the second switch 120, the current sensor 124, the controller 126, and/or other components. The power switch 112, the first switch 118, the second switch 120, the current sensor 124, the controller 126, and/or other components (and/or one or more functions of the components) may be hardware-implemented, software-implemented, or hardware and software-implemented. The power switch 112, the first switch 118, the second switch 120, the current sensor 124, the controller 126, and/or other components may function as described above with respect to FIGS. 1A-1C.

As shown in FIG. 2, the chip 220 may include a housing 221. The housing 221 may include a first capacitor connector 226, a second capacitor connector 224, an input power connector 222, an output power connector 228, and a ground connector 230. A connector may refer to one or more hardware and/or software that enables connections between two or more components/devices. As non-limiting examples, a connector may include one or more of a male connector, a female connector, a conductor, a pin, a socket, a node, an access point, and/or other connectors.

The first capacitor connector 226 may be configured to couple a first capacitor 206 to the first switch 118 (e.g., within/implemented by the chip 220). The first switch 118 may be coupled to a ground (e.g., the ground 210 through connections within/implemented by the chip 220 and the ground connector 230). The second capacitor connector 224 may be configured to couple a second capacitor 206 to the second switch 120 (e.g., within/implemented by the chip 220). The second switch 120 may be coupled to the ground (e.g., the ground 210 through connections within/implemented by the chip 220 and the ground connector 230). The input power connector 222 may be configured to couple to a power input 202. The output power connector 228 may be configured to couple to a power output 204. The ground connector 230 may be configured to couple to the ground 210. The coupling of the components may be done directly or indirectly.

The current sensor 124 (e.g., within/implemented by the chip 220) may be configured to measure a current of the first capacitor 206 and a current of the second capacitor 208. The controller 126 (e.g., within/implemented by the chip 220) may be configured to determine whether the capacitors 206, 208 shorts or opens based on the currents of the capacitors 206, 208.

The controller 126 may be configured to change the operating status of the first switch 118 and/or the second switch 120 based on the status of the first capacitor 206 and/or the second capacitor 208. For example, responsive to the first capacitor 206 shorting, the controller 126 may open the first switch 118. Responsive to the second capacitor 208 shorting, the controller 126 may open the second switch 120. Opening the switches 118, 120 responsive to the capacitors 206, 208 shorting may enable the controller 126 to prevent the power input 202 from being grounded (e.g., to ground 210) based on failure of the capacitors 206, 208.

The controller 126 may be configured to generate one or more alerts based on the status of the first capacitor 206 and/or the second capacitor 208. For example, responsive to the first capacitor 206 opening, the controller 126 may generate an alert that the first capacitor 206 has opened. Responsive to the first capacitor 206 shorting, the controller 126 may generate an alert that the first capacitor 206 has shorted. Responsive to the second capacitor 208 opening, the controller 126 may generate an alert that the second capacitor 208 has opened. Responsive to the second capacitor 208 shorting, the controller 126 may generate an alert that the second capacitor 208 has shorted. The controller 126 may perform other functions described above with respect to FIGS. 1A-1C.

Figure 3:
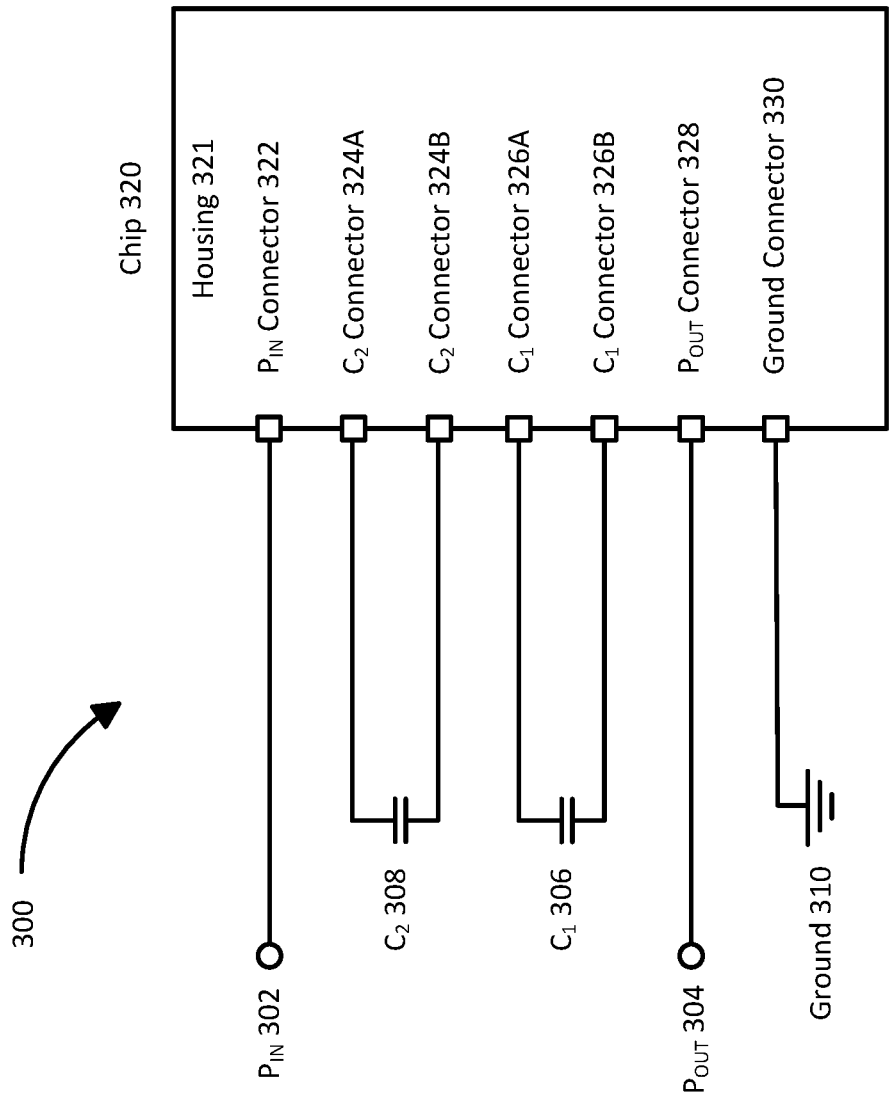

The connector configuration shown in FIG. 2 is one example of the disclosure and is not meant to be limiting. For example, FIG. 3 illustrates another example connector configuration. As shown in FIG. 3, system 300 may provide power management. The system 300 may include a chip 320 connected to power input 302, a first capacitor 306, a second capacitor 308, a power output 304, and a ground 310. The chip may include a housing 321, which includes two first capacitor connectors 326A, 326B, two second capacitor connectors 324A, 324B, an input power connector 322, an output power connector 328, and a ground connector 330. The connectors 322, 328, 330 may operate as the connectors 222, 228, 230 described above with respect to FIG. 3. The first capacitor connectors 326A, 326B may be configured to couple a first capacitor 306 to the first switch 118 (e.g., within/implemented by the chip 320). The second capacitor connectors 324A, 324B may be configured to couple a second capacitor 308 to the second switch 120 (e.g., within/implemented by the chip 320). Other configurations of connectors are contemplated.

Figure 4:
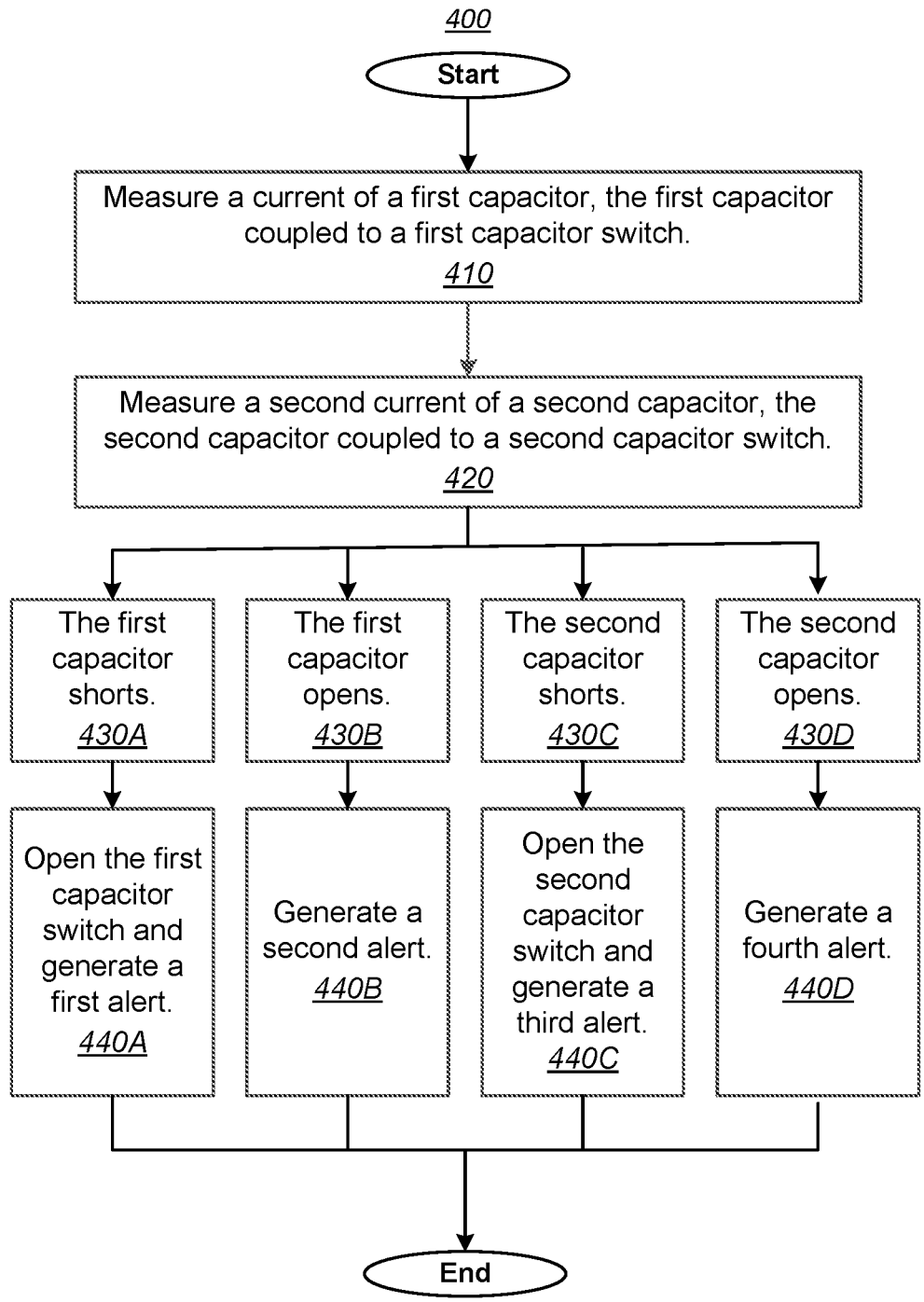
FIG. 4 illustrates a method for power management in accordance with some implementations of the disclosure.

FIG. 4 illustrates a method 400 for providing power management. The operations of the method 400 presented below are intended to be illustrative. In some implementations, the method 400 may be accomplished with one or more additional operations not described, and/or without one or more of the operations discussed. In some implementations, two or more of the operations may occur substantially simultaneously. In some implementations, one or more components of the systems shown in FIGS. 1A-1C, 2, and/or 3 may be configured to perform some or all of the method 400.

At operation 410, a first current of a first capacitor may be measured. The first capacitor may be coupled to a first switch and a power input.

At operation 420, a second current of a second capacitor may be measured. The second capacitor may be coupled to a second switch and the power input.

At operation 430, the status of the first capacitor and the second capacitor may be determined. At operation 430A, whether the first capacitor has shorted may be determined based on the first current. At operation 430B, whether the first capacitor has opened may be determined based on the first current. At operation 430C, whether the second capacitor has shorted may be determined based on the second current. At operation 430D, whether the second capacitor has opened may be determined based on the second current.

At operation 440, the operating status of the first switch and/or the second switch may be changed and/or one or more alerted may be generated based on the status of the first capacitor and the second capacitor. At operation 440A, the first switch may be opened and a first alert that the first capacitor has shorted may be generated responsive to the first capacitor shorting. At operation 440B, a second alert that the first capacitor has opened may be generated responsive to the first capacitor opening. At operation 440C, the second switch may be opened and a third alert that the second capacitor has shorted may be generated responsive to the second capacitor shorting. At operation 440D, a fourth alert that the second capacitor has opened may be generated responsive to the second capacitor opening.

Spatially relative terms such as "under," "below," "lower," "over," "upper," "left," "right," and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an" and "the" are intended to include the plural as well as the singular, unless the context clearly indicates otherwise.

Although this invention has been disclosed in the context of certain implementations and examples, it will be understood by those skilled in the art that the present invention extends beyond the specifically disclosed implementations to other alternative implementations and/or uses of the invention and obvious modifications and equivalents thereof. Thus, it is intended that the scope of the present invention herein disclosed should not be limited by the particular disclosed implementations described above.

Furthermore, the skilled artisan will recognize the interchangeability of various features from different implementations. In addition to the variations described herein, other known equivalents for each feature can be mixed and matched by one of ordinary skill in this art to construct analogous systems and techniques in accordance with principles of the present invention.

It is to be understood that not necessarily all objects or advantages may be achieved in accordance with any particular implementation of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

What is claimed is:

1. A system for providing power management, comprising:
   a power switch configured to couple to a power input, a first capacitor, a second capacitor, and a power output;
   a first switch configured to couple to the first capacitor;
   a second switch configured to couple to the second capacitor;
   a current sensor configured to couple to the first capacitor and the second capacitor, the current sensor configured to measure a first current of the first capacitor and a second current of the second capacitor;
   a controller coupled to the current sensor, the first switch, and the second switch, the controller configured to:
   determine whether the first capacitor shorts or opens based on the first current;
   determine whether the second capacitor shorts or opens based on the second current;
   responsive to the first capacitor shorting, open the first switch and generate a first alert that the first capacitor has shorted;
   responsive to the first capacitor opening, generate a second alert that the first capacitor has opened;
   responsive to the second capacitor shorting, open the second switch and generate a third alert that the second capacitor has shorted; and
   responsive to the second capacitor opening, generate a fourth alert that the second capacitor has opened.

2. The system of claim 1, wherein the power output includes a load.

3. The system of claim 1, wherein the power output includes a voltage bus.

4. The system of claim 1, wherein the controller is further configured to communicate the first alert, the second alert, the third alert, and the fourth alert to a computing device via an inter-integrated circuit protocol.

5. The system of claim 1, wherein the controller is further configured to communicate the first alert, the second alert, the third alert, and the fourth alert to a computing device via a serial communication protocol.

6. The system of claim 1, wherein the controller is further configured to communicate the first alert, the second alert, the third alert, and the fourth alert to a computing device via a wireless communication protocol.

7. The system of claim 1, wherein the power switch, the first switch, the second switch, the current sensor, and the controller are embedded in a chip.

8. The system of claim 1, wherein the controller is coupled to the power switch and is configured to open the power switch based on (1) the first capacitor shorting or opening, and (2) the second capacitor shorting or opening.

9. The system of claim 1, wherein the first switch is configured to couple the first capacitor to a ground and the second switch is configured to couple the second capacitor to the ground.

10. A chip for providing power management, comprising:
    a housing including:

a first capacitor connector configured to couple a first capacitor to a first switch;

a second capacitor connector configured to couple a second capacitor to a second switch;

an input power connector configured to couple to a power input;

an output power connector configured to couple to a power output;

a ground connector configured to couple to a ground;

a current sensor configured to measure a first current of the first capacitor and a second current of the second capacitor;

a controller configured to:
- determine whether the first capacitor shorts or opens based on the first current;
- determine whether the second capacitor shorts or opens based on the second current;
- responsive to the first capacitor shorting, open the first switch and generate a first alert that the first capacitor has shorted;
- responsive to the first capacitor opening, generate a second alert that the first capacitor has opened;
- responsive to the second capacitor shorting, open the second switch and generate a third alert that the second capacitor has shorted; and
- responsive to the second capacitor opening, generate a fourth alert that the second capacitor has opened.

11. The chip of claim 10, wherein the power output includes a load.

12. The chip of claim 10, wherein the power output includes a voltage bus.

13. The chip of claim 10, wherein the controller is further configured to communicate the first alert, the second alert, the third alert, and the fourth alert to a computing device via an inter-integrated circuit protocol.

14. The chip of claim 10, wherein the controller is further configured to communicate the first alert, the second alert, the third alert, and the fourth alert to a computing device via a serial communication protocol.

15. The chip of claim 10, wherein the controller is further configured to communicate the first alert, the second alert, the third alert, and the fourth alert to a computing device via a wireless communication protocol.

16. The chip of claim 10, wherein the controller is coupled to the power switch and is configured to open the power switch based on (1) the first capacitor shorting or opening, and (2) the second capacitor shorting or opening.

17. The chip of claim 10, wherein the first switch is configured to be coupled to the ground and the second switch is configured to be coupled to the ground.

18. A method for providing power management, comprising:
- measuring a first current of a first capacitor, the first capacitor coupled to a first switch and a power input;
- measuring a second current of a second capacitor, the second capacitor coupled to a second switch and the power input;
- determining whether the first capacitor shorts or opens based on the first current;
- determining whether the second capacitor shorts or opens based on the second current;
- responsive to the first capacitor shorting, opening the first switch and generating a first alert that the first capacitor has shorted;
- responsive to the first capacitor opening, generating a second alert that the first capacitor has opened;
- responsive to the second capacitor shorting, opening the second switch and generating a third alert that the second capacitor has shorted; and
- responsive to the second capacitor opening, generating a fourth alert that the second capacitor has opened.

19. The method of claim 18, wherein the first capacitor and the second capacitor are coupled to a power output through a power switch, the power output including a load or a voltage bus.

20. The method of claim 19, further comprising opening the power switch based on (1) the first capacitor shorting or opening, and (2) the second capacitor shorting or opening.

21. The method of claim 18, further comprising communicating the first alert, the second alert, the third alert, and the fourth alert to a computing device via an inter-integrated circuit protocol, a serial communication protocol, or a wireless communication protocol.

22. The method of claim 18, wherein the first switch and the second switch are embedded in a chip.

* * * * *